United States Patent [19]

Hoffman

[11] 4,403,107
[45] Sep. 6, 1983

[54] STAMPED CIRCUIT BOARD

[75] Inventor: Norman E. Hoffman, Harrisburg, Pa.

[73] Assignee: AMP Incorporated, Harrisburg, Pa.

[21] Appl. No.: 216,573

[22] Filed: Dec. 15, 1980

[51] Int. Cl.³ .................. H05K 1/02; B32B 31/00; B05D 1/12; B32B 3/12
[52] U.S. Cl. .................. 174/68.5; 29/849; 156/250; 427/96; 427/276; 428/158; 428/313.3; 428/319.1; 428/901
[58] Field of Search ............ 428/158, 159, 901, 162, 428/164, 319.1, 313.3, 313.7, 313.9; 156/250, 248; 174/68.5; 29/849; 72/326, 414; 427/276, 96; 264/321

[56] References Cited

U.S. PATENT DOCUMENTS

| | | | |
|---|---|---|---|
| 2,757,443 | 8/1956 | Steigerwalt et al. | 156/250 |
| 3,239,915 | 3/1966 | McGinley et al. | 29/849 |
| 3,470,059 | 9/1969 | Jonnes | 428/313.9 |
| 3,506,533 | 4/1970 | Berner | 428/158 |
| 3,628,243 | 12/1971 | Phol et al. | 29/625 |
| 3,697,668 | 10/1972 | Campbell | 174/68.5 |
| 3,873,392 | 3/1975 | Niebylski et al. | 428/319.1 |
| 3,931,762 | 1/1976 | Fukushima et al. | 264/321 |
| 4,095,008 | 6/1978 | Sundstrom et al. | 428/159 |

FOREIGN PATENT DOCUMENTS 1452337 10/1976 United Kingdom .............. 174/68.5

OTHER PUBLICATIONS

Haining et al., IBM Technical Disclosure Bulletin, vol. 22, No. 5, (Oct. 1979), p. 1799.

Primary Examiner—William R. Dixon, Jr.
Attorney, Agent, or Firm—Richard B. O'Planick; Adrian J. LaRue

[57] ABSTRACT

A circuit board is fabricated comprising a metal layer laminated to an underlying dielectric substrate. Portions of the metal layer are separated and recessed into stable indented portions of the substrate by a stamping die, roller, or the like. The substrate is composed of a cellular material, for example, polysulfone impregnated with hollow glass spheres, whereby the indented portions of the substrate are compacted by impression of the die profile to receive separated portions of the metal layer therein.

4 Claims, 4 Drawing Figures

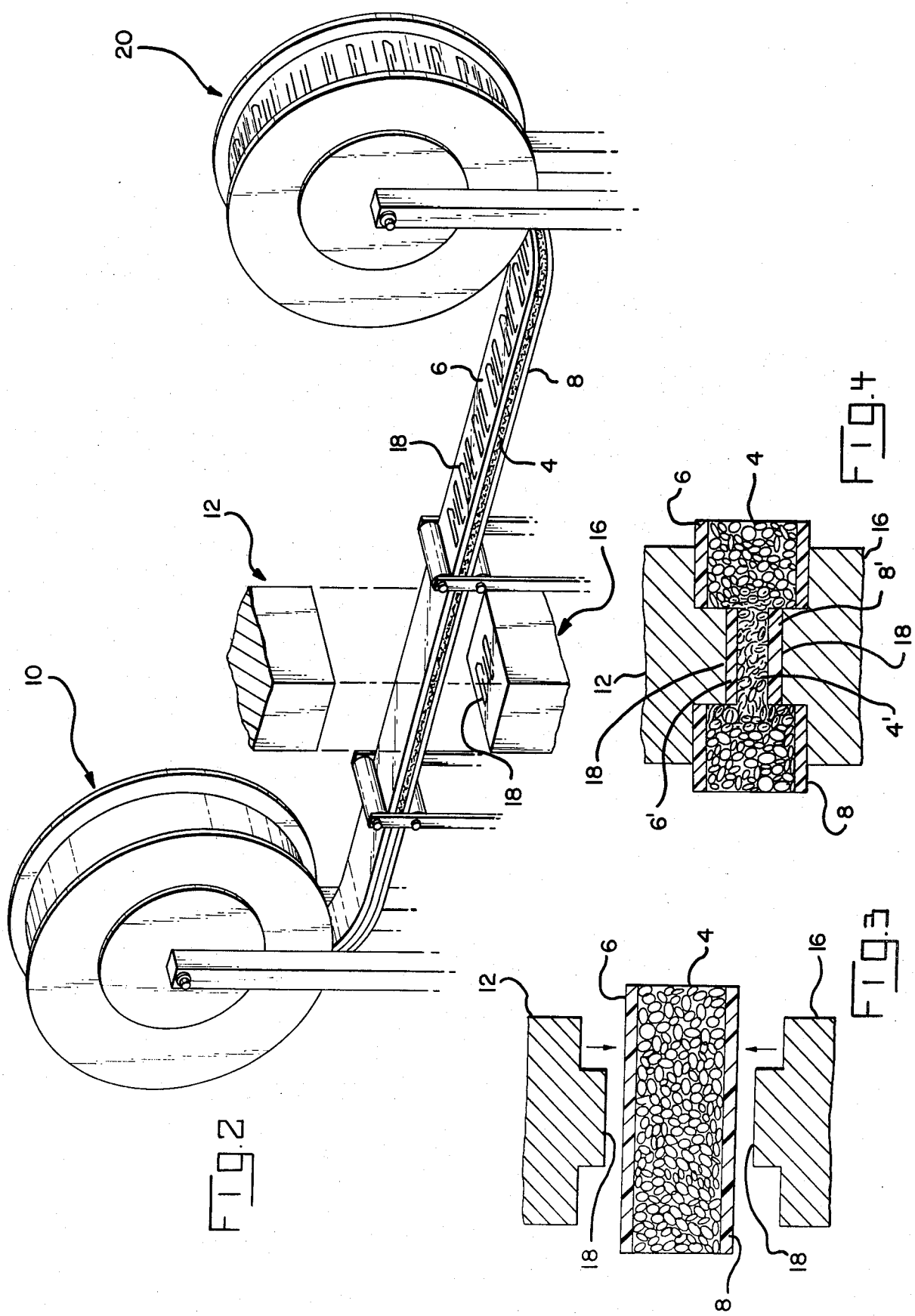

STAMPED CIRCUIT BOARD

BACKGROUND OF THE INVENTION

1. Field of the Invention

The invention relates to the fabrication of circuit boards having circuit patterns formed in plural planes. Specifically, the invention relates to selection of substrate materials for accommodating said fabrication.

2. The Prior Art

A number of processes are available from the prior art for the fabrication of circuit boards of the type comprising a dielectric substrate having a pattern of electrical path conductors thereon. For example, in one process, a conductive laminate is provided over the dielectric and coated with an etchant resist material which decomposes when exposed to light of particular wavelength. Upon shielding the resist by a pattern of opaque circuit paths, the decomposed resist material is removed by an etchant except for that which is covered by the pattern of resist material.

The application of metal by electroplating to a sensitized substrate is another technique known by those skilled in the art. However, etching or electroplating processes are costly, step intensive, and limited as to the circuitry density achievable thereby.

A further approach consists of laminating a dielectric substrate with a layer of metal, and then striking the metal with a stamping die. The face of the die is impressed with a pattern of circuitry which shears the metal laminate into a pattern of circuit conductors, separated from one another along the lines of shear. The die also indents the substrate forming permanent indentations into which separated portions of the metal laminate are recessed.

Such a technique is taught by U.S. Pat. No. 3,628,243. The primary shortcoming of the above approach rests as a consequence of the stamping operation. The die profile, in shearing and recessing the separated metal portions into the substrate, causes complementary protrusions to emerge from the underside of the substrate; the protrusions being comprised of substrate material which is displaced by the penetration of the die. As a result, circuitry on such boards must be restricted to one side of the substrate; the opposite side of the substrate being rendered useless by the protrusions made to emerge therefrom. While one sided circuitry is functional, it would obviously be economically preferable to use both substrate sides for circuitry. Even for those applications where only one sided circuitry is required, it would be desirable to preserve geometrical uniformity on the underside of the substrate to readily facilitate packaging.

SUMMARY OF THE PRESENT INVENTION

The present invention is embodied by a circuit board comprising a dielectric substrate having a metal layer bonded to one side thereof. Portions of the metal are separated by the shearing action of a die face, and recessed into stable substrate indentations. The substrate is composed of a base dielectric material, such as polysulfone, impregnated with cellular agents. Recession of separated metal portions into the substrate can thus be achieved without causing irregularities on the underside of the substrate due to material displacement. The recessed portions of separated metal are electrically isolated from the remainder of the metal layer and provides a circuitry pattern. Alternatively, both sides of the substrate have a respective metal layer bonded thereto, and each undergoes a simultaneous or discrete stamping operation to produce a circuit board having two sided circuitry. Such a double stamping sequence is achieved without causing geometrical deformation to the substrate, due to a composition of the substrate pursuant the present invention.

Accordingly, it is an object of the present invention to provide a dielectric substrate composition for circuit boards which facilitates impression of a metallic circuit pattern therein without altering the external geometric shape of the substrate.

It is a further object of the present invention to provide a dielectric substrate composition for circuit boards which facilitates impression of metallic circuit patterns into both opposite sides of the substrate.

Still a further object of the present invention is to provide a dielectric substrate composition for circuit boards fabricated by impressing separated metallic portions into stable substrate indentations.

Another object of the present invention is to provide a circuit board having circuit path conductors in plural planes.

A further object of the present invention is to provide a circuit board which is economically and readily produced.

These and other objects of the present invention, which will be apparent to those skilled in the art, are achieved by a preferred embodiment which is described in detail below, and which is illustrated in the accompanying drawings.

BRIEF DESCRIPTION OF THE ACCOMPANYING DRAWINGS

FIG. 2 is a perspective view of a reel to reel stamping line in which a circuit pattern is impressed into a continuous strip of a circuit board laminated structure.

FIG. 3 is a section view through the subject circuit board laminated structure prior to the stamping of a circuit pattern therein.

FIG. 4 is a section view through the subject circuit board subsequent to the stamping of a circuit pattern therein.

DETAILED DESCRIPTION OF THE PREFERRED EMBODIMENT

Figure 1:
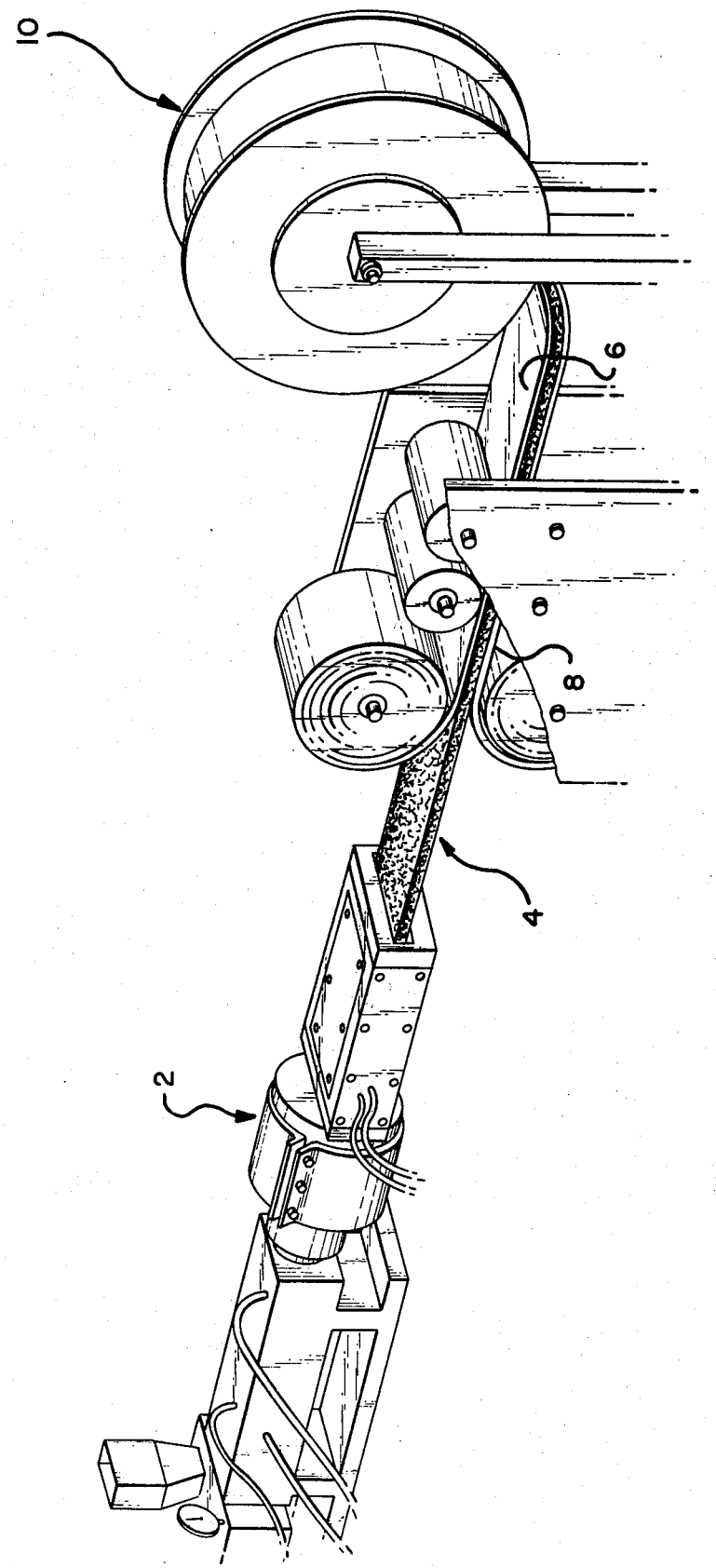
FIG. 1 is a perspective view of a fabrication facility in which the present circuit board is fabricated by the application of metallic layers to opposite sides of a dielectric substrate.

Referring to FIG. 1, a conventional extruder line 2 is illustrated for extruding in strip form of continuous strip of substrate material 4. The substrate material 4 is composed of dielectric material having a cellular or porous profile as described further below. A top layer 6 and bottom layer 8 of a conductive metal, such as copper, is bonded to both opposite sides of the substrate 4 in a continuous fashion. The resultant laminated structure is then taken up by the reel 10.

Continuing to FIG. 2, the reel 10 is then dereeled, and the laminar strip is passed between a set of upper and lower stamping dies 12, 16. Each of the dies is constructed having a deeply impressed pattern of circuit paths in a stamping die face thereof. As the laminar strip is passed between the opposed faces of the die set, as shown in FIGS. 3 and 4, the raised portion 18 of the dies 12, 16 stamp and shear respective conductive layers 6, 8 into a pattern of circuit path conductors, separated from one another along the lines of shear.

FIG. 4 illustrates that the raised portion 18 of the dies 12, 16 also indent the substrate 4, forming permanent indentations or recesses into which are received recessed or inset portions 6', 8' of the metal layers 6, 8. The recessed portions 6', 8' of the conductive layers 6, 8 are separated from and electrically isolated from other portions of the metal layers 6, 8.

Referring collectively to FIGS. 3 and 4, the substrate 4 is composed of a base resin, such as polysulfone. For example, a typical material suitable for the purpose of the present invention can be commercially obtained from Union Carbide, Boundbrook, N.J. The polysulfone dielectric has the following ASTM properties: Specific Gravity 1.24, Tensile Elongation to Break 50-100%, Tensile Elongation to Yeild 5-6%, Tensile Yield Strength 10,200 psi, Shear to Yield 6000 psi.

A homogeneous batch of the polysulfone material is then impregnated with a cellular agent, for example, glass bubbles of 1-2 mil. diameter, having a glass thickness of 50 micro inches. The resultant composition can be controlled to achieve differing concentrations of glass bubbles in order to produce substrates having differing compaction characteristics. It has been determined that the concentration of glass bubbles can be as high as 20% by weight. The composition of polysulfone and glass bubbles can be described mathematically as evidenced by the following equations.

Beginning with $$D \text{ (Density)} = \frac{W \text{ (Weight)}}{V \text{ (Volume)}},$$

the following equations have been derived:

$$D_C = \frac{D_B D_P}{K_B D_P + (1 - K_B) D_B}$$

$$K_{AB} = \frac{D_G - D_B}{D_G}$$

$$V_{AC} = \frac{K_B K_{AB} W_C}{D_B}$$

$$K_{AC} = \frac{K_{AB} K_B D_C}{D_B}$$

$$K_{GC} = \frac{K_B D_C}{D_G}$$

$$K_{BC} = \frac{K_B D_C}{D_B}$$

Symbols used above are defined as:
$D_C$ = Density of Plastic/Bubble Composite.
$D_B$ = Density of Bubble.
$D_P$ = Density of Plastic.
$K_B$ = Ratio of Bubble Weight to Composite Weight
$D_G$ = Density of Bubble Material
$V_{AC}$ = Volume of Air in Composite
$K_{AB}$ = Ratio of Bubble-Air Volume to Total Bubble Volume
$W_C$ = Weight of Composite
$K_{AC}$ = Ratio of Total Air Volume to Total Composite Volume
$K_{GC}$ = Ratio of Total Bubble-Material Volume to Total Composite Volume
$K_{BC}$ = Ratio of Total Bubble Volume to Total Composite Volume Sample calculations are summarized in the following table, with the Penetration column representing the extent of die penetration in the stamping operation. The ratio of bubble weight to composite weight $K_B$ is established as the independent variable for the calculations on which the table is based.

| $K_B$ (%) | $D_C$ (Gm/cc) | $K_{AC}$ (%) | $K_{GE}$ (%) | $K_{BC}$ (%) | PENETRATION (Mils) [60 × $K_{AC}$] |
|---|---|---|---|---|---|
| 15 | 0.9257 | 31.0 | 5.5 | 36.5 | 18.6 |
| 20 | 0.8536 | 38.2 | 6.7 | 44.9 | 22.9 |
| 25 | 0.7919 | 44.2 | 7.9 | 52.1 | 26.5 |

It will be apparent that as the concentration of bubbles by weight is increased, the distance of penetration of the raised die portions 18 into the substrate 4 increases, all other factors remaining constant. Physically, the substrate immediately beneath die portions 18 compacts volumetrically as the die protrusions penetrate therein, as shown in FIG. 4. This permits achievement of a double sided circuit board since no protrusions are caused due to stress relieving displacement of material. Other techniques for producing the desired circuit pattern, such as rolling an impression die across the laminated structure can also be used as will be apparent to those skilled in the art. Also, the extruded laminated structure can be produced by casting the polysulfone/glass bubble composite in a molding process.

While the above substrate composition is preferred, other compositions of materials may be substituted without departing from the present invention. For example, thermosetting plastics material such as epoxy or phenolic may be used as the base substrate material. Alternatively, commercial thermoplastics such as polyimide (commercially known as Ultrm), or polyphenoline sulfide (Ryton) may be used. As a substitute for glass bubbles, the practitioner of the present invention may option to use commonly available chemical blowing agents to introduce porosity in any of the above listed substrate base materials.

The above description of preferred and alternative embodiments of the subject invention is not intended to be all-inclusive. Other embodiments which utilize the teachings herein set forth, and which will be apparent to one skilled in the art, are intended to be within the scope and spirit of the present invention.

What is claimed is:

1. A circuit board of the type comprising a dielectric substrate and a layer of metal bonded to at least one surface thereof with portions of said metal layer being recessed as metal portions into said substrate characterized in that:
    said substrate comprising a cellular material formed either from a polymer matrix having fracturable bubbles therein or a blown polymeric foam which volumetrically compacts to receive said recessed metal portions therein as stable indented portions separated from said metal layer without resultant protrusions corresponding to said recessed metal portions occurring at the other surface of said substrate.

2. A circuit board as set forth in claim 1, wherein said cellular material comprises a homogenous mixture of plastics carrier material and material means for inducing porosity in said carrier material.

3. A circuit board as set forth in claim 2, wherein said plastics carrier material comprises polysulfone.

4. A circuit board as set forth in claim 2, wherein said material means comprises glass bubbles.

* * * * *